(12) United States Patent
Otremba et al.

(10) Patent No.: US 7,265,564 B2
(45) Date of Patent: Sep. 4, 2007

(54) METHOD FOR TESTING A CONTACT REGION OF A SEMICONDUCTOR MODULE

(75) Inventors: Ralf Otremba, Kaufbeuren (DE); Josef Hoglauer, Munich (DE); Christian Musshoff, Villach (AT); Jens Oetjen, Ottenhofen/Herdweg (DE)

(73) Assignee: Infineon Technologies AG, Munich (DE)

( * ) Notice: Subject to any disclaimer, the term of this patent is extended or adjusted under 35 U.S.C. 154(b) by 120 days.

(21) Appl. No.: 11/233,348

(22) Filed: Sep. 22, 2005

(65) Prior Publication Data

US 2006/0066336 A1 Mar. 30, 2006

(30) Foreign Application Priority Data

Sep. 27, 2004 (DE) .................. 10 2004 046 800

(51) Int. Cl.
*G01R 31/02* (2006.01)
*G01R 31/28* (2006.01)
(52) U.S. Cl. ..................................... 324/760
(58) Field of Classification Search ............... None
See application file for complete search history.

(56) References Cited

U.S. PATENT DOCUMENTS 5,568,055 A * 10/1996 Olsen .................... 324/718

6,909,271 B2 * 6/2005 Sloneker et al. ........ 324/117 R

FOREIGN PATENT DOCUMENTS

DE 19726534 12/1998
DE 19824064 12/1999

* cited by examiner

*Primary Examiner*—Ha Tran Nguyen
*Assistant Examiner*—Trung Q. Nguyen
(74) *Attorney, Agent, or Firm*—Dicke, Billig & Czaja, PLLC

(57) ABSTRACT

A method for testing a contact region of a semiconductor module having a circuit arrangement is disclosed. In one embodiment, the semiconductor module is heated by an electrical heating current flow and the electrical and/or thermal quality of a plurality of contacts provided in the contact region is determined in the process from a temperature-dependent measurement quantity. The heating current flow is formed by a plurality of heating current pulses. The application of the heating current pulses leads to different phases of the measurement quantity. The different phases are assigned to the different contacts and evaluated correspondingly for determining the electrical and/or thermal quality of the contacts.

39 Claims, 11 Drawing Sheets

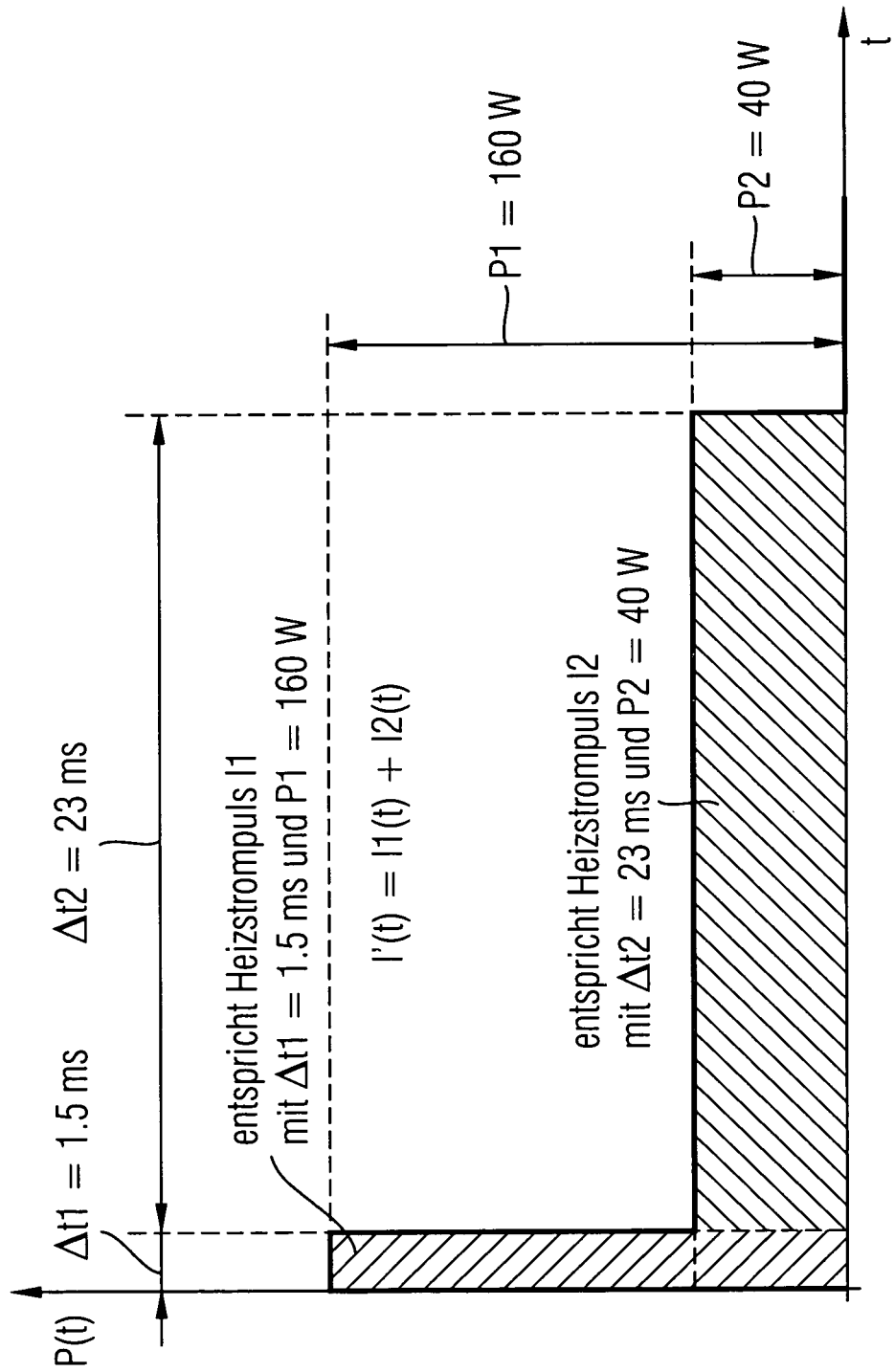

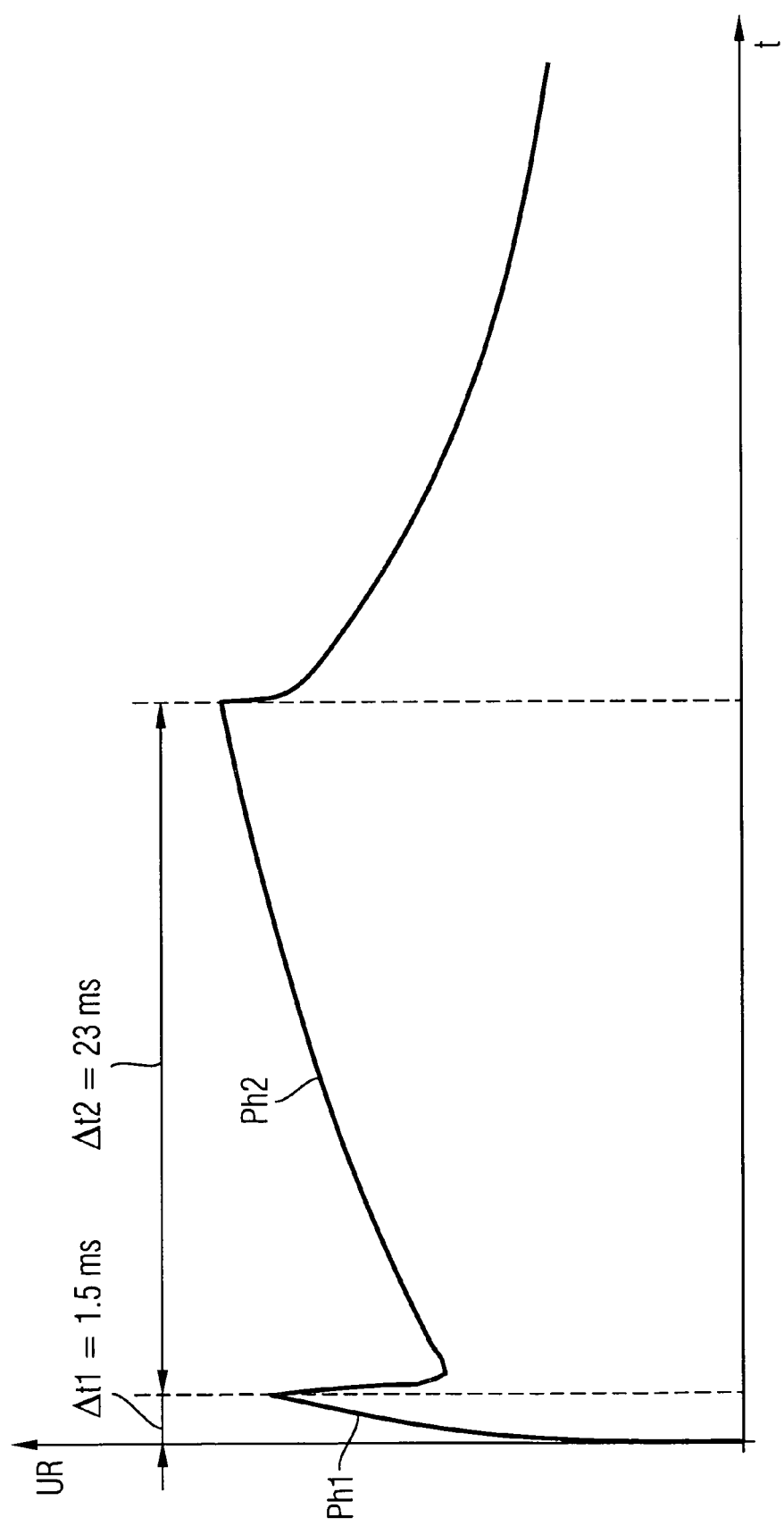

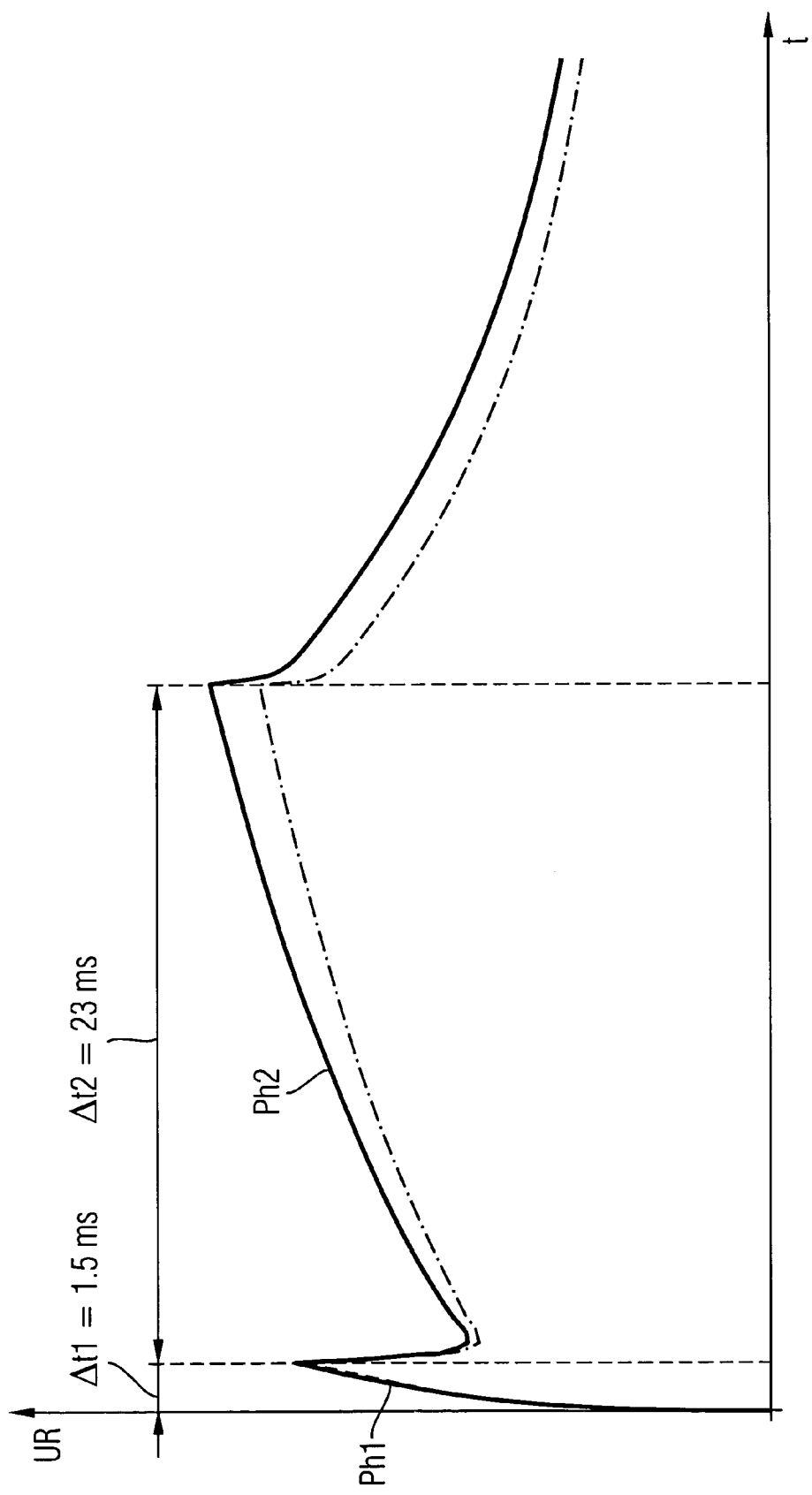

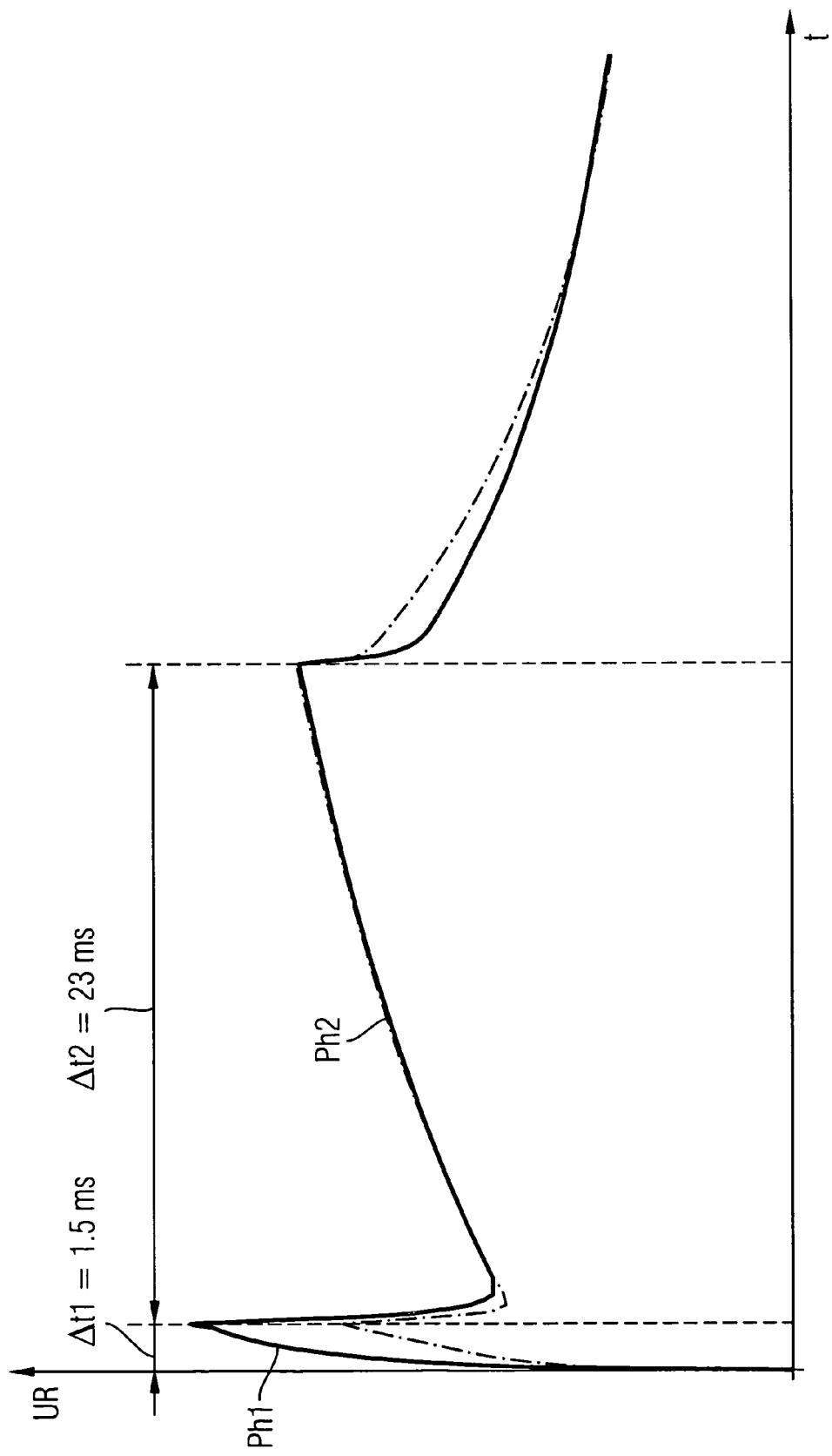

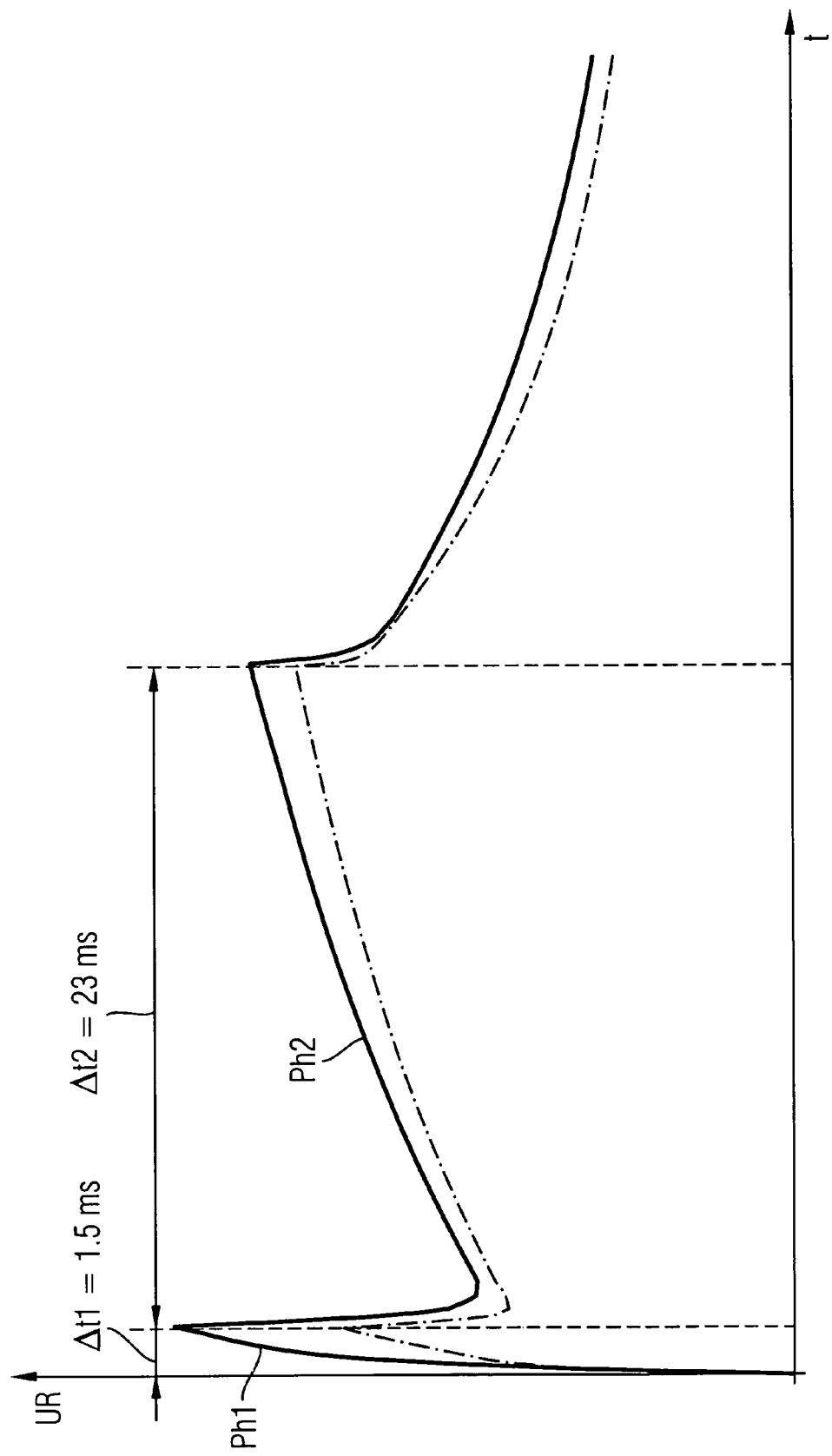

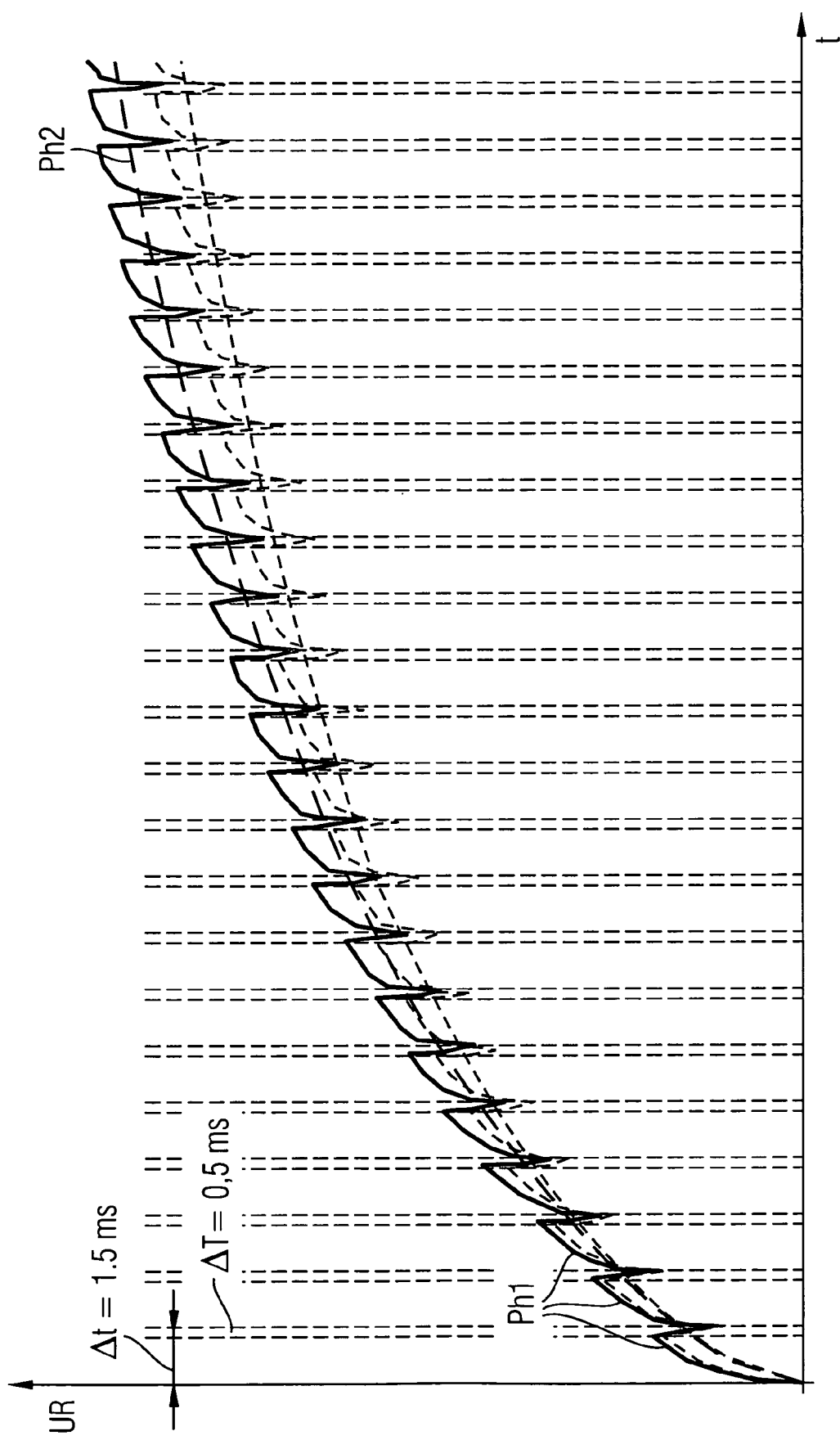

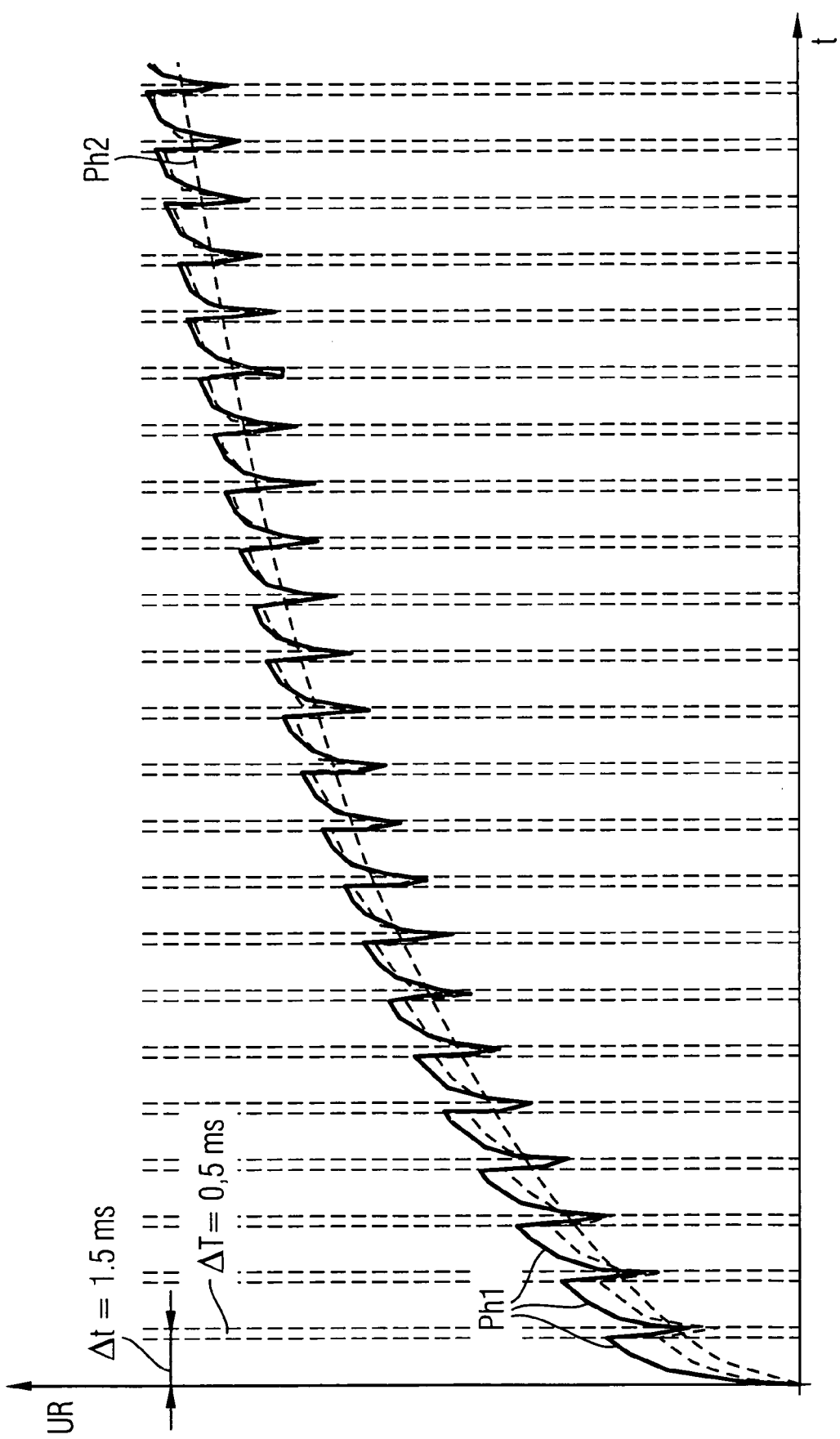

METHOD FOR TESTING A CONTACT REGION OF A SEMICONDUCTOR MODULE

CROSS-REFERENCE TO RELATED APPLICATIONS

This Utility Patent Application claims priority to German Patent Application No. DE 10 2004 046 800.1, filed on Sep. 27, 2004, which is incorporated herein by reference.

FIELD OF THE INVENTION

The present invention relates to a method for testing a contact region, and in particular a method for testing a contact region of a semiconductor module, in particular of a power semiconductor module. More precisely, the present invention relates to a method for testing a contact region of a semiconductor module having a backward diode, a plurality of contacts being formed in the contact region. This involves, in particular, a method for assessing two-sided chip solderings by means of a multiple delta-VSD test.

BACKGROUND

In the case of semiconductor components, that is to say in particular in the case of semiconductor modules, and in particular in the case of power semiconductor modules, the production thereof, within various intermediate stages of the production process, also in mass production, requires so-called electrical and/or thermal series tests in order to be able to assess the quality of the contact connections of specific contact regions from an electrical and/or thermal standpoint. This is a matter in particular of assessing the quality of solderings on a chip rear side by means of a so-called delta-VSD test.

What is problematic about such tests is that modern power semiconductor components, and in particular power semiconductor modules have a multiplicity of contacts and contact regions which have entirely different thermal and/or electrical properties on account of their structure. In conventional tests, all contact or contact types interact integrally and cannot be considered separately from one another with regard to their different electrical and/or thermal properties on account of the test structure. This often also has the effect that properties with regard to a first contact type mask the measurement results with regard to the properties of a second contact type that is different from the first contact type.

SUMMARY

The present invention provides a method for testing a contact region in which, in a particularly simple yet reliable manner, the electrical and/or thermal qualities of different contacts or contact types of the contact region can be determined and represented in a manner well distinguished from one another.

In one embodiment, the present invention provides a method for testing a contact region having a plurality of contacts of a semiconductor module having a circuit arrangement. The semiconductor module is actively heated by electrical heating current. A temperature-dependent physical quantity of the semiconductor module and its temporal profile are measured and evaluated as measurement quantities. The electrical and thermal quality of the contacts is determined from the measurement quantity of the semiconductor module and from the temporal profile of said measurement quantity.

The heating current is formed by a plurality of heating current pulses. Different phases of the measurement quantity of the semiconductor module and in the temporal profile thereof are generated by the application of the heating current pulses. The different phases of the measurement quantity of the semiconductor module and in the temporal profile thereof are assigned to different contacts and are correspondingly evaluated for determining the electrical and thermal quality of the contacts.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 3 illustrates, in the form of a graph, the temporal profile of the communicated thermal power in accordance with a first embodiment of the method according to the invention for testing a contact region.

FIGS. 4A-D are graphs illustrating the result for different contact qualities in the form of graphs, to be precise upon application of the heating current flow illustrated in FIG. 3.

FIGS. 6A-C are graphs illustrating the result for different contact qualities in the form of the graphs, to be precise upon application of the heating current flow illustrated in FIG. 5.

DETAILED DESCRIPTION

Figure 1:
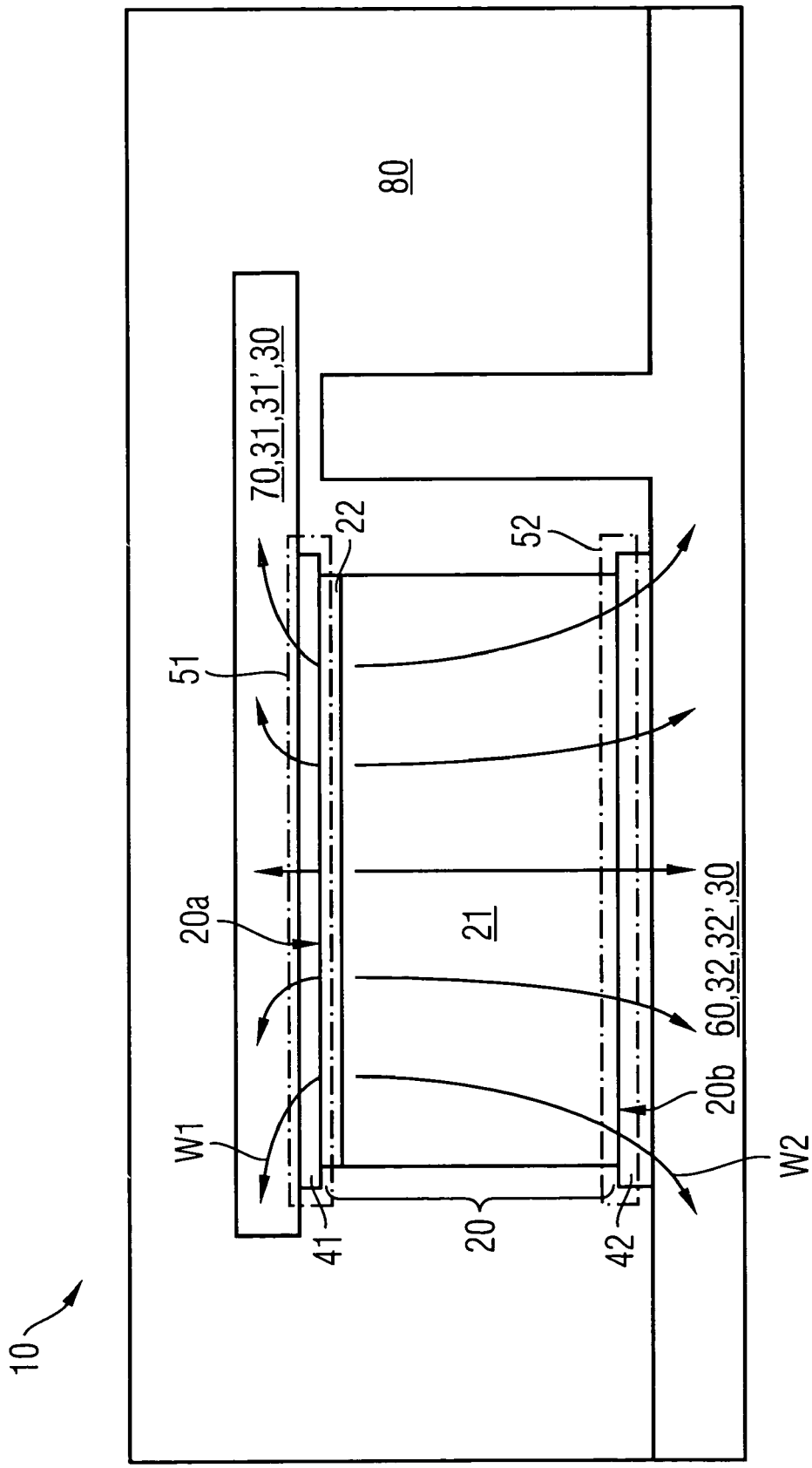
FIG. 1 illustrates one embodiment of a schematic and sectional side view of a power semiconductor module in which the method according to the invention for testing contact regions can be employed.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, the method according to the invention for testing a contact region is designed, in particular, for testing a contact region of a semiconductor module having a circuit arrangement having a plurality of contacts. In one embodiment of the method according to the invention, the semiconductor module is actively heated by electrical heating current flow. According to one embodiment of the invention, one temperature-dependent physical quality of the circuit arrangement of the semiconductor module and/or the temporal profile thereof are measured and/or evaluated as measurement quantities. The electrical and/or the thermal quality of the contacts are determined from the measurement quantity of the semiconductor module and/or of the temporal profile thereof. According to one embodiment of the invention, the heating current flow is formed by a plurality of heating current pulses. Different phases of the measurement quantity of the semiconductor module and/or in the temporal profile thereof are generated by the application of the heating current pulses. These different phases in the measurement quantity of the semiconductor module and/or in the temporal profile thereof are assigned to different contacts and correspondingly evaluated for determining the electrical and/or thermal quality of the contacts.

In one embodiment, the present invention provides for a heating current flow to be composed of a plurality of heating current pulses, so that different phases in the measured measurement quantity of the circuit arrangement of the semiconductor module are produced, which can be assigned to different contacts in order thus to serve for determining the electrical and/or thermal quality of the different contacts.

An electrical physical quantity and/or the temporal profile thereof may be measured and/or evaluated as measurement quantities.

In particular, a threshold voltage, a breakdown voltage or a forward voltage of the semiconductor module and/or the temporal profiles thereof may be measured and/or evaluated as measurement quantities.

It is furthermore conceivable for precisely one or else a plurality of physical quantities of the semiconductor module and/or the temporal profiles thereof to be measured and/or evaluated as measurement quantities for determining the electrical and/or thermal quality of the contacts.

In particular, the forward voltage of a backward diode of the semiconductor module and/or the temporal profile thereof may be measured and/or evaluated as measurement quantities.

In one embodiment of the method according to the invention for testing contact regions, it is provided in addition or as an alternative that temporarily separate and/or temporarily successive heating current pulses are used.

In another embodiment of the method according to the invention for testing contact regions, it is provided in addition or as an alternative that temporarily superposed or superposing heating current pulses are used.

It is conceivable, on the one hand, for a plurality of identical heating current pulses to be used.

As an alternative or in addition it is conceivable for a plurality comprising two or more different heating current pulses to be used.

In a particularly preferred development of the method according to the invention for testing contact regions, it is provided in addition or as an alternative that a plurality of heating current pulses comprising a first heating current pulse and comprising a second heating current pulse are used.

In this case, it is provided that the second heating current pulse is applied temporarily directly subsequent to the first heating current pulse.

In addition or as an alternative it is provided that the first heating current pulse has a shorter first pulse duration than the second pulse duration of the second heating current pulse.

Furthermore, it is provided in addition or as an alternative that the first pulse duration is approximately 10% of the second pulse duration or less.

In one development of the method according to the invention for testing contact regions, it is provided that the first pulse duration is approximately 1.5 ms.

In another development of the method according to the invention for testing contact regions, it is provided in addition or as an alternative that the second pulse duration is approximately 23 ms.

It may be provided that a higher first electrical and/or thermal power is imparted by the first heating current pulse than a second electrical and/or thermal power for the second heating current pulse.

In another development of the method according to the invention for testing contact regions, it is provided in addition or as an alternative that the value for the first electrical and/or thermal power is approximately four times the value of the second electrical and/or thermal power.

In one development of the method according to the invention for testing contact regions, it is provided in addition or as an alternative that the value for the first electrical and thermal power is approximately 160 W.

In another advantageous development of the method according to the invention for testing contact regions, it is provided in addition or as an alternative that the value for the second electrical and/or thermal power is approximately 40 W.

In one advantageous development of the method according to the invention for testing contact regions, it is provided in addition or as an alternative that by means of or with the first heating current pulse, a first phase of the forward voltage of the backward diode is generated and/or assigned, in particular with a temporal profile approximately in the temporal range of the first pulse duration.

In a further refinement of the method according to the invention for testing contact regions, it is provided in addition or as an alternative that, by means of or with the second heating current pulse, a second phase of the forward voltage of the backward diode is generated and assigned, in particular with a temporal profile approximately in the temporal range of the second pulse duration.

In a further development of the method according to the invention for testing contact regions, it is provided in addition or as an alternative that the first heating current pulse and/or the first phase of the forward voltage of the backward diode are assigned to a first contact and/or a first contact type and correspondingly evaluated.

In one embodiment, the first contact and/or the first contact type describes or represents a contact between a chip and a contact clip, in particular of a power semiconductor module.

Further, in addition or as an alternative for the second heating current pulse and/or the second phase of the forward voltage of the backward diode assigned to a second contact and/or a second contact type and/or correspondingly evaluated.

In one embodiment of the method according to the invention for testing contact regions, it is provided that the second contact and/or the second contact type describe or represent a contact between a chip and a leadframe, in particular of a power semiconductor module.

In another embodiment of the method according to the invention for testing contact regions, it is provided that the plurality of heating pulses is formed by repeated and temporarily successive application of a given heating current pulse having a given pulse duration and a given electrical and/or thermal power to be imparted.

In this case, it may be provided that the repeated and temporarily successive application of the heating current pulses is in each case interrupted by an interruption time period between two temporarily directly successive heating current pulses.

Furthermore, it may be advantageous for the interruption time period between two temporarily directly successive heating current pulses to be in each case the same.

In one embodiment of the method according to the invention for testing contact regions, it is provided in addition or as an alternative that the interruption time period between two temporarily directly successive heating current pulses is in each case less than the pulse duration of the heating current pulses.

In another embodiment of the method according to the invention for testing contact regions, it is provided in addition or as an alternative that the interruption time period between two temporarily directly successive heating current pulses is approximately one third of the pulse duration.

Furthermore, it may be provided in addition or as an alternative that the interruption time period between two temporarily directly successive heating current pulses is approximately 0.5 ms.

It may further be provided in addition or as an alternative that the pulse duration of the heating current pulses is approximately 1.5 ms.

In one embodiment of the method according to the invention for testing contact regions, it is provided in addition or as an alternative that the imparted electrical and/or thermal power of the heating current pulses is approximately 100 W.

Furthermore, in addition or as an alternative by means of the heating current pulse, in each case a first phase of the forward voltage of the backward diode is generated and/or assigned thereto with a temporal profile in the temporal range of the pulse duration of the heating pulse.

In one embodiment of the method according to the invention for testing contact regions, it is provided in addition or as an alternative that by means of the totality of the plurality of heating pulses, a second phase of the forward voltage of the backward diode is generated and/or assigned thereto, in particular in the form of an average or envelope of the corresponding plurality of first phases in the profile of the forward voltage of the backward diode and/or in particular with a temporal profile in the temporal range corresponding approximately to the totality of the plurality of heating current pulses applied.

In another embodiment of the method according to the invention for testing contact regions, it may be provided in addition or as an alternative that the individual heating current pulse and/or the first phase of the forward voltage of the backward diode are assigned to a first contact and/or a first contact type and correspondingly evaluated.

In another embodiment of the method according to the invention for testing contact regions, it is provided in addition or as an alternative that the first contact and/or the second contact type describe or represent a contact between a chip and a contact clip, in particular of a power semiconductor module.

In one embodiment of the method according to the invention for testing contact regions, it is provided in addition or as an alternative that the totality of the plurality of heating current pulses and/or the second phase of the forward voltage of the backward diode are assigned to a second contact and/or a second contact type and correspondingly evaluated.

In addition or as an alternative, the second contact and/or the second contact type describe or represent a contact between a chip and a leadframe, in particular of a power semiconductor module.

These and further aspects of the present invention are explained below.

In one embodiment, the present invention relates in particular to the assessment of two-sided chip solderings by means of a multiple delta-VSD test.

In principle, in the electrical series test of power semiconductor components, it is customary to assess the soldering of the chip rear side by a delta-VSD test. The principle consists in actively heating the chip by means of a current pulse. If the chip soldering is poor, e.g., owing to a shrink hole or an excessively high layer thickness, then the component becomes hotter than a well-soldered chip. The temperature rise is determined by means of the difference between two measurements of the forward voltage or the VSD of the backward diode of the chip or component, e.g. of a MOSFET transistor; therefore, the basic principle is also called the delta-VSD test.

The contact on the chip top side is produced by means of bonding wires. The development of new packaging technologies in which a large-area clip is soldered or adhesively bonded on the top side gives rise to the possibility or necessity of also testing this connection in the context of the electrical series testing.

The simple delta-VSD test cannot be used directly here since the thermal time constants for the two junctions are very different—e.g., owing to the distance from the measured pn junction to the upper and lower soldering.

It is also possible for more than two different heating pulses to be employed, with the result that basically every interface and every volume within the component can thereby be examined in parallel. Examples that are taken into consideration here, besides the abovementioned connecting layers between chip and clip or between chip and leadframe, also include the connecting layers between component and circuit board or alternatively a volume assessment with regard to inhomogeneities or cracks.

In addition to the forward voltage of the backward diode as measurement quantity, it is also possible to use other measurement quantities if the latter exhibit a characteristic temperature behavior and a corresponding temperature dependence. By way of example, a threshold voltage (Vth) or a breakdown voltage (Vbrdss) can be evaluated. These measurement quantities assume a different value within the measurement range for each temperature. The temperature of the chip can thus be determined by means of the measurement of the corresponding chip parameter or of the measurement quantity. Consequently, the component quality can be estimated and monitored since, in the event of disturbances such as e.g., delaminations or cracks, the chip temperature rises to a greater extent during the heating pulses and the intrinsic measurement quantities thus change.

Similar structures and elements are designated by the same reference symbols hereinafter without a detailed description of the respective elements being repeated each time said reference symbols occur.

FIG. 1 illustrates one embodiment of a sectional side view of the structure of a power semiconductor module 10 in which it is possible to employ a method according to the invention for testing a contact region 30 of a semiconductor module 10 when a plurality of the contacts 31 and 32 occur.

The power semiconductor module 10 illustrated in FIG. 1 is based on a so-called chip 20 constructed from a lower region 21 or first section 21 and also an electronically active structure 22 in the surface region 20a of the chip 20. The chip 20 has e.g., a thickness of e.g., approximately 200 μm, in which case the electronically active structure 22 may have a layer thickness in the region of e.g., approximately 20 μm.

A second or lower connecting layer 42 to the underlying leadframe 60 is provided as second contact element 52 in the region of the underside 20b of the chip 20. The structure comprising chip underside 20b, lower connecting layer 42 and chip carrier 60 or leadframe 60 defines the second contact 32 or the second contact type 32' of the contact region 30 of the semiconductor module 10.

The top side 20a of the chip with the circuit region 22 provided there is adjoined by a first or upper connecting layer 41 to the contact clip 70—provided thereabove—as first contact element 51, so that the surface region 20a, the upper connecting layer 42 and also the contact clip 70 form a first contact 31 or a first contact type 31' of the contact region 30 of the semiconductor module 10.

The contact clip 70 is thus also referred to as second contact element 52, and the chip carrier 60 or the leadframe 60 is thus also referred to as second contact element 52.

Via the underside 20b and the top side 20a of the chip 20, corresponding heat flows W1 and W2 take place via the lower connecting layer 42 and the upper connecting layer 41 during operation of the module 10, the forward voltage of the backward diode provided correspondingly being influenced by means of said heat flows. The heat flows W1, W2 are indicated by arrows in FIG. 1.

According to one embodiment of the invention, in particular by means of the combination of a first delta-VSD test with a second delta-VSD test, an assessment becomes possible with regard to the interface of chip rear side 20b/leadframe 60 and additionally chip front side 20a/contact clip 70, so that it is possible, in particular, to use already existing measurement equipment in the so-called back-end process in order to register the quality of the new connecting technologies.

In this case, it is important for the assignment of the signal phases and the corresponding evaluation that e.g., the thermal diffusion time for silicon in the case of a thermal path of approximately 200 μm at the position of chip 20/leadframe 60 is approximately 4 ms, whereas the thermal diffusion time for silicon in the case of a thermal path of 20 μm in the region of chip 20/source clip 70 is approximately 0.04 ms.

Figure 2:
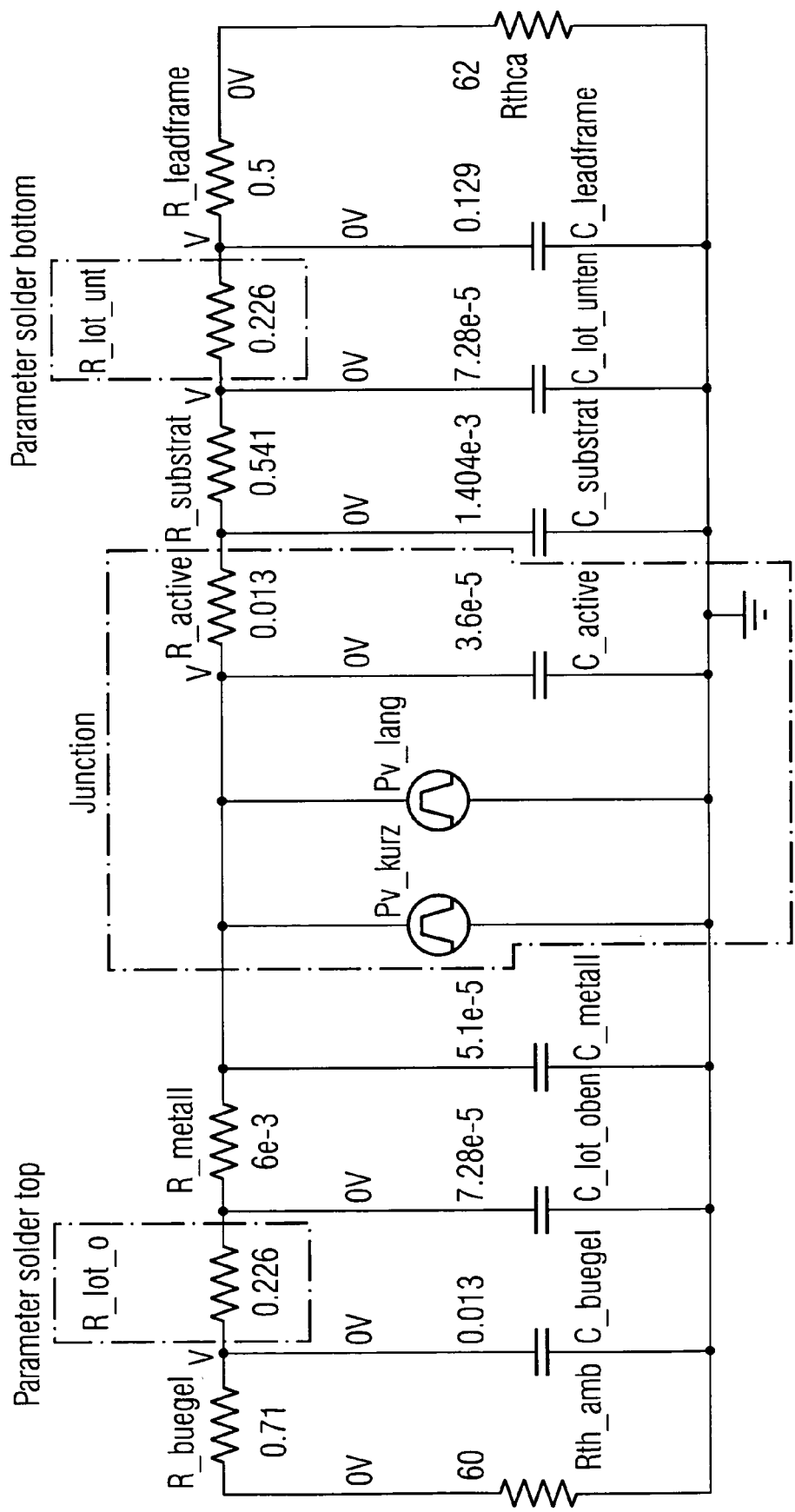
FIG. 2 is the schematic representation of a thermal scheme for the power semiconductor module illustrated in FIG. 1.

FIG. 2 illustrates an electrical and/or thermal scheme that schematically represents the conditions of the arrangement of the semiconductor module 10 from FIG. 1.

FIG. 3 illustrates, in the form of a graph the temporal profile of the applied total thermal power P(t) as a function of time t in the case of a first embodiment of the method according to the invention for testing a contact region 30, in which a first configuration for the heating current flow I' is used, the latter being formed by a first heating current pulse I1 having a first pulse duration $\Delta t1=1.5$ ms and a first electrical and/or thermal power P1=160 W and a second heating current pulse I2 having a second pulse duration $\Delta t2=23$ ms and a second electrical and/or thermal power P2=40 W: I'(t)=I1(t)+I2(t).

FIGS. 4A to 4D illustrate the reaction, e.g., of the power semiconductor module 10 illustrated in FIG. 1, for different quality scenarios, the return voltage UR or forward voltage UR of a backward diode of the circuit arrangement of a semiconductor module 10 being illustrated as measurement quantity UR.

FIGS. 4A to 4D in each case illustrate the profiles of the return voltage UR of the backward diode of the semiconductor module 10 as a function of time t. The illustration in each case illustrates a first phase Ph1, which corresponds to the first heating current pulse I1 and is assigned thereto, and also a second phase Ph2, which corresponds to the second heating current pulse I2 and is assigned thereto. The first phase Ph1 represents the thermal quality of the first contact 31, that is to say the contact 31 at the clip 70. The second phase Ph2 represents the quality of the second contact 32, that is to say of the contact 32 at the leadframe 60. The first phase Ph1 and the second Ph2 in each case correspond to approximately exponential saturation functions, as is expected for thermal compensation processes.

The higher the maximum amplitudes in each case of the first phase Ph1 and of the second phase Ph2, the lower the respective quality of the first and second contacts 31 and 32 is to be assessed, that is to say that a poor contact 31, 32 leads to an increased thermal budget, in each case represented in the first phase Ph1 and in the second phase ph2 for the forward voltage UR of the backward diode of the semiconductor module 10 in the form of an increased signal phase amplitude.

FIG. 4A illustrates a situation in which good soldering connections are present with regard to the first contact 31 at the clip 70 and at the second contact 32 at the leadframe 60. The first and second phases PH1 and Ph2 of the forward voltage of the backward diode of the semiconductor circuit module 10 have specific maximum amplitudes in the case of good soldering connections with regard to the clip 70 and the leadframe 60.

FIG. 4B illustrates one embodiment in which the thermal contact resistance Rth for the soldering at the leadframe 60 is doubled, which corresponds to a deterioration in the thermal quality of the second contact 32. The first phase Ph1 of the forward voltage UR of the backward diode of the module 10, which, after all, describes the first contact 31 at the clip 70, is uninfluenced in this case. By contrast, the maximum amplitude of the second phase Ph2 of the forward voltage UR of the backward diode, which describes the quality of the second contact 32 at the leadframe 60, is measurably increased in comparison with the situation from FIG. 4A. The measurement curve from FIG. 4A is indicated in a dotted manner in FIG. 4B for comparison.

In the situation in FIG. 4C, by contrast, there is a deterioration at the first contact 31 at the clip 70, namely through doubling of the thermal contact resistance Rth present there, whereas the connection at the second contact 32 at the leadframe 60 has a high quality. The alteration of the thermal contact at the first contact 31 at the clip 70 exclusively influences the first phase Ph1 of the forward voltage UR of the backward diode of the module 10, to be precise the amplitude of the first phase Ph1 is increased, whereas the second phase Ph2 of the forward voltage UR of the backward diode of the module 10 remains uninfluenced. In comparison with FIG. 1, the amplitude of the first phase Ph1 of the forward voltage UR of the backward diode of the module 10, which describes the thermal quality of the first contact 31 at the clip 70, is measureably increased, corresponding to a loss of quality through doubling of the thermal contact resistance Rth in the region of the clip 70. The measurement curve from FIG. 4A is indicated in a dotted manner in FIG. 4C for comparison.

Finally, in FIG. 4D, both the first contact 31 at the clip 70 and the second contact 32 at the leadframe 60 of the module 10 are in each impaired through a doubling of the thermal contact resistance Rth respectively present, thus resulting in a significant increase in the maximum amplitudes for the first phase Ph1 and for the second phase Ph2 in comparison with the situation in FIG. 4A. The measurement curve from FIG. 4A is indicated in a dotted manner in FIG. 4D for comparison.

It can thus be established that the quality of the first and second contacts 31 and 32 at the contact clip 70 and at the leadframe 60, respectively, can be determined by measuring the maximum amplitudes of the first phase Ph1 and of the second Ph2 of the forward voltage UR of the backward diode of the module 10.

Figure 5:
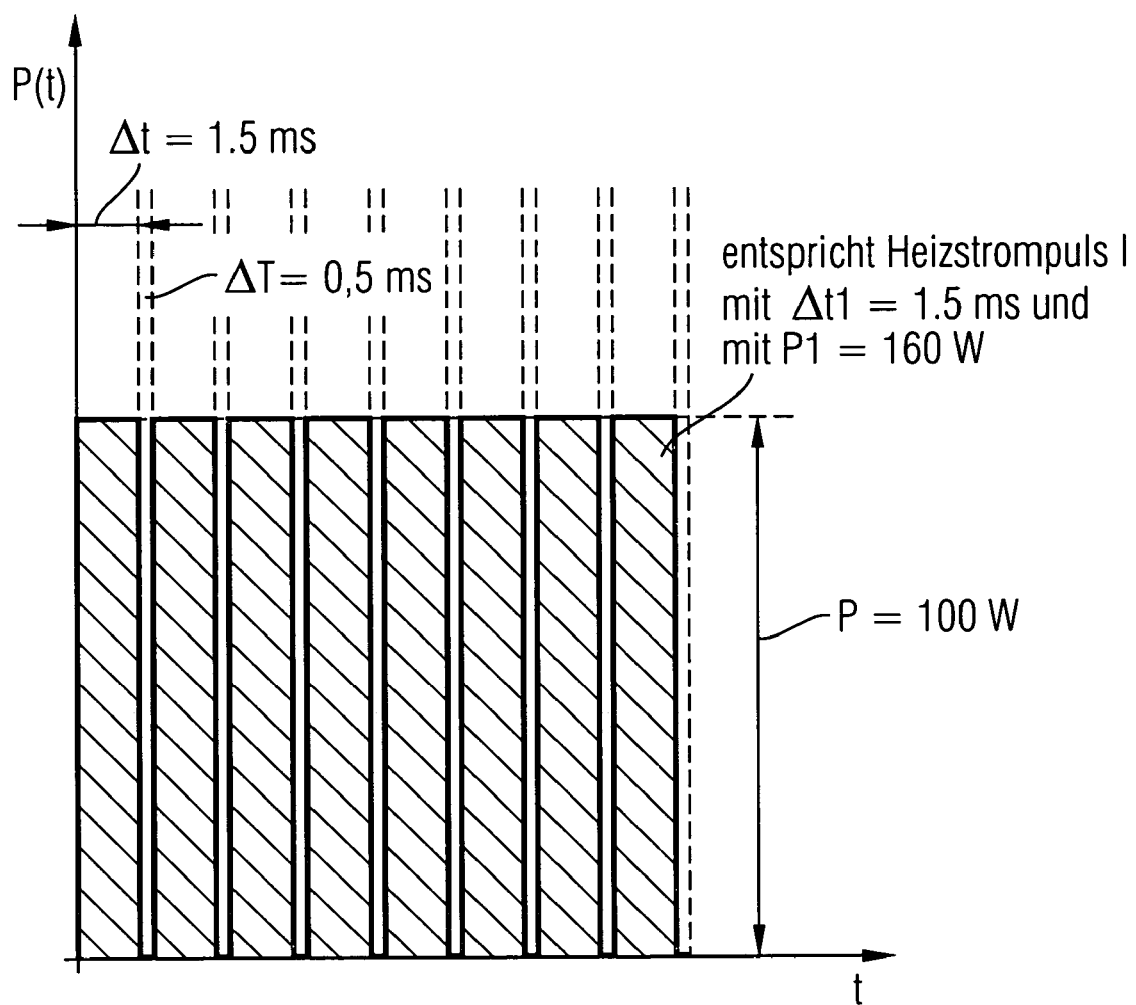
FIG. 5 illustrates, in the form of a graph, the temporal profile of the communicated thermal power in accordance with another embodiment of the method according to the invention for testing a contact region.

FIG. 5 illustrates, in the form of a graph, the temporal profile of the imparted electrical and/or thermal power P(t) for a different variant of the heating current flow I', the imparted electrical and/or thermal power P(t) being represented as a function of time t. The temporal profile of the imparted electrical and/or thermal power P(t) results from a heating current flow I' as superposition or repetition of an electrical heating current pulse I having a pulse duration $\Delta t=1.5$ ms and an imparted electrical and/or thermal power P=100 W, the individual heating current pulses I being applied temporarily successively and between temporarily directly successive heating current pulses I there being an interruption time period $\Delta T=0.5$ ms in which no electrical and/or thermal power is actively imparted.

Figure 6A:
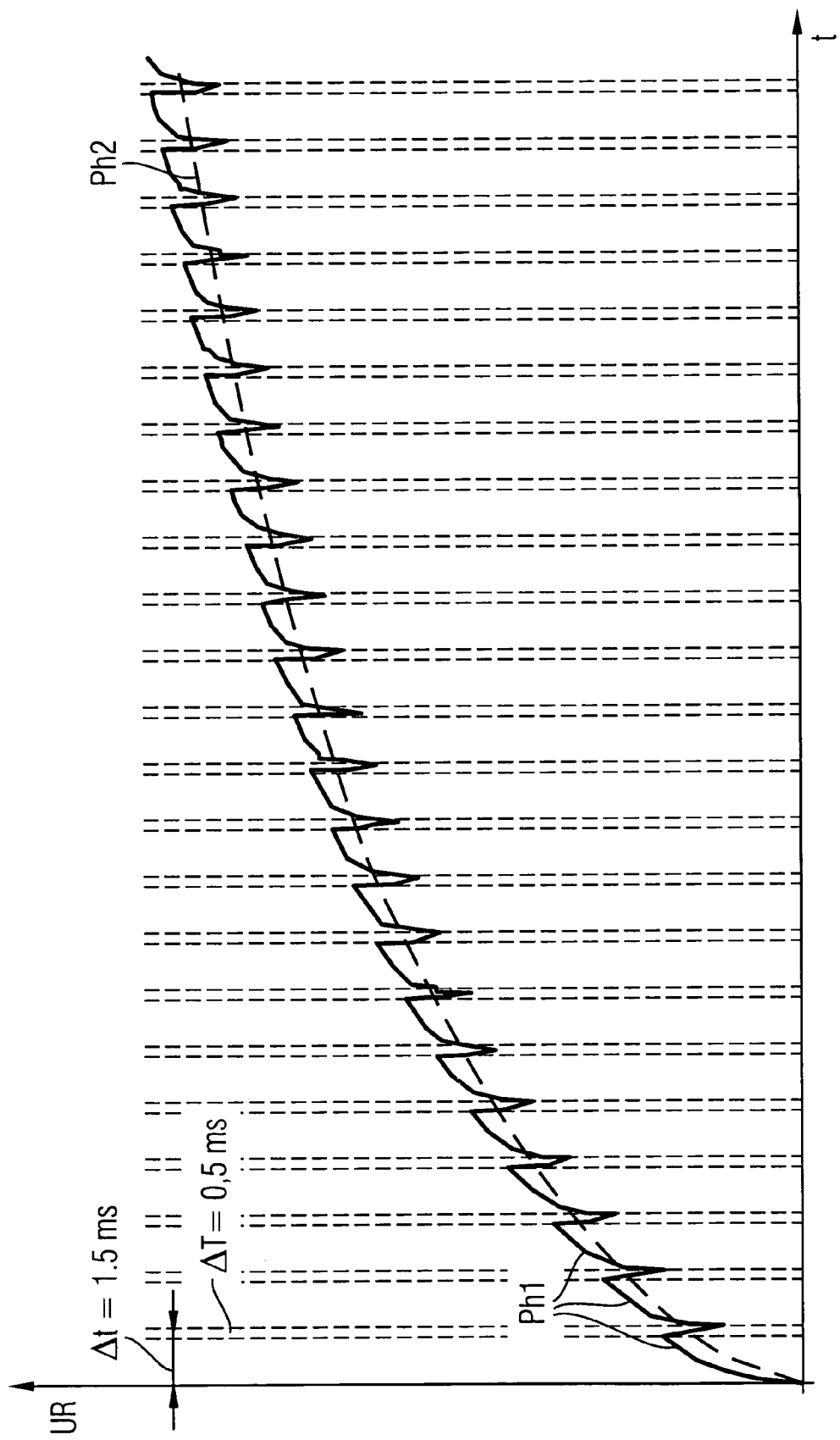

In response to the heating pulse sequence—illustrated in FIG. 5—for the heating current flow I' and the profile thus imparted for the applied electrical and/or thermal power P, in another preferred embodiment of the method according to the invention for testing a contact region of a semiconductor module 10, said semiconductor module 10, in a manner dependent on the thermal and/or electrical qualities of the first and second contacts 31 and 32, respectively, exhibits different modes of behavior with regard to the forward voltage UR of a backward diode of the circuit arrangement of a semiconductor module 10 as measurement quantity UR; these are illustrated in FIGS. 6A to 6C.

FIG. 6A illustrates in the form of a graph, in a manner similar to that in the case of FIG. 4A, the normal conditions under which the electrical and/or thermal quality of the first contact 31 and of the second contact 32 of the contact region 30 of the semiconductor module 10 are formed normally or well.

In a manner corresponding to each of the individual heating current pulses I from FIG. 5, there arises in an assigned manner in this case a first phase Ph1 of the forward voltage UR of the backward diode, to be precise once again approximately in the form of an exponential saturation curve which qualitatively corresponds in essential terms to the profile of the first phase Ph1 for the forward voltage UR of the backward diode of the semiconductor module 10 from FIG. 4A. The repetition of the individual heating current pulse I in the profile of the heating current flow I' correspondingly leads to a repetition of the first phase Ph1, but in the overall profile of the signal for the forward voltage UR of the backward diode on average or as an envelope there likewise results an exponential saturation function in the form of a second phase Ph2 for the forward voltage UR of the backward diode of the semiconductor module 10.

As in the case of the previous embodiment in accordance with FIGS. 4A to 4D, the first phase Ph1 describes the thermal and/or electrical behavior and thus the corresponding thermal and/or electrical quality of the first contact 31 at the top side 20a of the chip 20 toward the corresponding clip 70. By contrast, the second phase Ph2 of the forward voltage UR of the backward diode once again describes the electrical and/or thermal quality of the second contact 32 on the underside 20b of the chip 20 toward the leadframe 60.

In contrast to the normal conditions illustrated in FIG. 6A, in the case of the embodiment of the FIG. 6B, poorer contact conditions in the sense of a doubled thermal contact resistance Rth are present in the region of the second contact 32 between chip 20 and leadframe 60. This is manifested in the fact that the second phase Ph2 for the forward voltage UR of the backward diode of the semiconductor module 10 is increased with regard to the maximum amplitude compared with FIG. 6A. The amplitude of the first phases Ph1, which describe the electrical and/or thermal quality in the region of the first contact 31 between chip 20 and contact clip 70, are essentially uninfluenced. The measurement curve from FIG. 6A is indicated in a dotted manner in FIG. 6B for comparison.

In contrast to this, FIG. 6C illustrates conditions under which, although the electrical and/or thermal quality of the second contact 32 between chip 20 and leadframe 60 are normal, the electrical and/or thermal quality in the region of the first contact 31 between chip 20 and contact clip 70 are formed in an impaired manner through doubling of the thermal contact resistance Rth. This is manifested in the fact that the amplitudes of the first phases Ph1 of the forward voltage UR of the backward diode of the semiconductor module 10 are increased compared with the conditions illustrated in FIGS. 6A and 6B. However, the amplitude of the second phase Ph2 of the forward voltage UR of the backward diode of the semiconductor module 10, that is to say the envelope or averaged curve of the profile of the forward voltage UR of the backward diode of the semiconductor module 10, is uninfluenced by this. The measurement curve from FIG. 6A is indicated in a dotted manner in FIG. 6C for comparison.

Thus, from the conditions illustrated in FIGS. 6A to 6C, from the amplitudes of the first phase Ph1 and the second phase Ph2, it is possible to determine the electrical and/or thermal qualities in the region of the first contact 31 between chip 20 and contact clip 70 and in the region of the second contact 32 between chip 20 and leadframe 60, an increased amplitude in each case corresponding to an impaired thermal and/or electrical quality.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for testing a contact region having a plurality of contacts, of a semiconductor module having a circuit arrangement, comprising:
  actively heating the semiconductor module by electrical heating current formed by a plurality of heating current pulses;
  measuring and evaluating a temperature-dependent physical quantity of the semiconductor module and its temporal profile as measurement quantities;

determining the electrical and thermal quality of the contacts from the measurement quantity of the semiconductor module and from the temporal profile of the measurement quantity;

generating different phases of the measurement quantity of the semiconductor module and in the temporal profile thereof by the application of the heating current pulses; and assigning the different phases of the measurement quantity of the semiconductor module and in the temporal profile thereof to different contacts and are correspondingly evaluated for determining the electrical and thermal quality of the contacts.

2. The method of claim 1, comprising measuring and evaluating an electrical physical quantity and the temporal profile as measurement quantities.

3. The method of claim 1, comprising measuring and evaluating a measurement quantity or a combination of measurement quantities from a group consisting of a threshold voltage, a breakdown voltage, a forward voltage of the semiconductor module and the temporal profiles.

4. The method of claim 1, comprising determining the electrical and thermal quality of the contacts by measuring and evaluating a plurality of physical quantities of the semiconductor module and the temporal profiles thereof as measurement quantities.

5. The method of claim 1, comprising measuring and evaluating the forward voltage of a backward diode of the semiconductor module and the temporal profile thereof as measurement quantities.

6. The method of claim 1, comprising using temporally separate and temporally successive heating current pulses.

7. The method of claim 1, comprising using temporally superposed heating current pulses.

8. The method of claim 1, comprising using a plurality of identical heating current pulses.

9. The method of claim 1, comprising using a plurality of different heating current pulses.

10. A method for testing a contact region having a plurality of contacts, of a semiconductor module having a circuit arrangement, comprising:

actively heating the semiconductor module by electrical heating current formed by a plurality of heating current pulses;

measuring and evaluating a temperature-dependent physical quantity of the semiconductor module and its temporal profile as measurement quantities;

determining the electrical and thermal quality of the contacts from the measurement quantity of the semiconductor module and from the temporal profile of the measurement quantity;

generating different phases of the measurement quantity of the semiconductor module and in the temporal profile thereof by the application of the heating current pulses; and assigning the different phases of the measurement quantity of the semiconductor module and in the temporal profile thereof to different contacts and are correspondingly evaluated for determining the electrical and thermal quality of the contacts using a plurality of heating current pulses comprising a first heating current pulse and comprising a second heating current.

11. The method of claim 10, comprising applying the second heating current pulse temporarily directly subsequent to the first heating current pulse.

12. The method of claim 10, comprising wherein the first heating current pulse has a shorter first pulse duration than the second pulse duration of the second heating current pulse.

13. The method of claim 12, comprising wherein the first pulse duration is approximately 10% of the second pulse duration or less.

14. The method of claim 12, comprising wherein the first pulse duration is approximately 1.5 ms.

15. The method of claim 12, comprising wherein the second pulse duration is approximately 23 ms.

16. The method of claim 12, in which a higher first electrical and thermal power is imparted by the first heating current pulse and a second electrical and thermal power for the second heating current pulse.

17. The method of claim 16, comprising wherein the value for the first electrical and/or thermal power is approximately four times the value of the second electrical and/or thermal power.

18. The method of claim 16, comprising wherein the value for the first electrical and thermal power is approximately 160 W.

19. The method of claim 16, comprising wherein the value for the second electrical and thermal power is approximately 40 W.

20. A method for testing a contact region having a plurality of contacts, of a semiconductor module having a circuit arrangement, comprising:

actively heating the semiconductor module by electrical heating current formed by a plurality of heating current pulses;

measuring and evaluating a temperature-dependent physical quantity of the semiconductor module and its temporal profile as measurement quantities;

determining the electrical and thermal quality of the contacts from the measurement quantity of the semiconductor module and from the temporal profile of the measurement quantity;

generating different phases of the measurement quantity of the semiconductor module and in the temporal profile thereof by the application of the heating current pulses; and assigning the different phases of the measurement quantity of the semiconductor module and in the temporal profile thereof to different contacts and are correspondingly evaluated for determining the electrical and thermal quality of the contacts comprising using temporally separate and temporally successive heating current pulses, in which, by means of or with the first heating current pulse, a first phase of the measurement quantity, and in particular of the forward voltage of the backward diode is generated and assigned, in particular with a temporal profile approximately in the temporal range of the first pulse duration.

21. The method of claim 20, comprising wherein by means of or with the second heating current pulse, a second phase of the measurement quantity, and in particular of the forward voltage of the backward diode is generated and assigned, in particular with a temporal profile approximately in the temporal range of the second pulse duration.

22. The method of claim 21, comprising wherein the second contact or the second contact type describe a contact between a chip and a leadframe of a power semiconductor module.

23. The method of claim 20, comprising wherein the first heating current pulse and the first phase of the measurement quantity, and in particular of the forward voltage of the backward diode are assigned to a first contact and a first contact type and correspondingly evaluated.

24. The method of claim 23, comprising wherein the first contact or the first contact type describe a contact between a chip and a contact clip, in particular of a power semiconductor module.

25. The method of claim 20, comprising wherein the second heating current pulse and the second phase of the measurement quantity, and in particular of the forward voltage of the backward diode are assigned to a second contact or a second contact type and correspondingly evaluated.

26. A method for testing a contact region having a plurality of contacts, of a semiconductor module having a circuit arrangement, comprising:
   actively heating the semiconductor module by electrical heating current formed by a plurality of heating current pulses;
   measuring and evaluating a temperature-dependent physical quantity of the semiconductor module and its temporal profile as measurement quantities;
   determining the electrical and thermal quality of the contacts from the measurement quantity of the semiconductor module and from the temporal profile of the measurement quantity;
   generating different phases of the measurement quantity of the semiconductor module and in the temporal profile thereof by the application of the heating current pulses; and
   assigning the different phases of the measurement quantity of the semiconductor module and in the temporal profile thereof to different contacts and are correspondingly evaluated for determining the electrical and thermal quality of the contacts comprising wherein the plurality of heating pulses is formed by repeated and temporarily successive application of a given heating current pulse having a given pulse duration and a given electrical and thermal power to be imparted.

27. The method of claim 26, comprising wherein the repeated and temporarily successive application of the heating current pulses is in each case interrupted by an interruption time period between two temporarily directly successive heating current pulses.

28. The method of claim 27, comprising wherein the interruption time period between two temporarily directly successive heating current pulses is in each case the same.

29. The method of claim 27, comprising wherein the interruption time period between two temporarily directly successive heating current pulses is in each case less than the pulse duration of the heating current pulses.

30. The method of claim 27, comprising wherein the interruption time period between two temporarily directly successive heating current pulses is approximately one third of the pulse duration.

31. The method of claim 27, comprising wherein the interruption time period between two temporarily directly successive heating current pulses is approximately 0.5 ms.

32. The method of claim 26, comprising wherein the pulse duration of the heating current pulses is approximately 1.5 ms.

33. The method of claim 26, comprising wherein the imparted electrical and thermal power of the heating current pulses is approximately 100 W.

34. The method of claim 26, comprising wherein, by means of the heating current pulse, in each case a first phase of the measurement quantity and in particular of the forward voltage of the backward diode is generated and assigned thereto with a temporal profile in the temporal range of the pulse duration of the heating pulse.

35. The method of claim 26, comprising wherein by means of the totality of the plurality of heating pulses, a second phase of the measurement quantity, and in particular of the forward voltage of the backward diode is generated or assigned thereto in the form of an average or envelope of the corresponding plurality of first phases in the profile of the measurement quantity, and in particular of the forward voltage of the backward diode, and with a temporal profile in a temporal range corresponding approximately to the totality of the plurality of heating current pulses applied.

36. The method of claim 26, comprising wherein the individual heating current pulse and the first phase of the measurement quantity, and in particular of the forward voltage of the backward diode are assigned to a first contact or a first contact type and correspondingly evaluated.

37. The method of claim 36, comprising wherein the first contact or the first contact type describe a contact between a chip and a contact clip, in particular of a power semiconductor module.

38. The method of claim 26, comprising wherein the totality of the plurality of heating current pulses and the second phase of the measurement quantity, and in particular of the forward voltage of the backward diode are assigned to a second contact or a second contact type and correspondingly evaluated.

39. The method of claim 38, comprising wherein the second contact or the second contact type describe or represent a contact between a chip and a leadframe or a leadframe of a power semiconductor module.

* * * * *